United States Patent
Koscielnik et al.

(10) Patent No.: US 9,698,814 B2
(45) Date of Patent: Jul. 4, 2017

(54) METHOD AND APPARATUS FOR INDIRECT CONVERSION OF VOLTAGE VALUE TO DIGITAL WORD

(71) Applicant: Akademia Gorniczo-Hutnicza im. Stanislawa Staszica, Cracow (PL)

(72) Inventors: Dariusz Koscielnik, Cracow (PL); Marek Miskowicz, Cracow (PL)

(73) Assignee: AKADEMIA GORNICZO-HUTNICZA IM. STANISLAWA STASZICA, Cracow (PL)

( * ) Notice: Subject to any disclaimer, the term of this patent is extended or adjusted under 35 U.S.C. 154(b) by 0 days.

(21) Appl. No.: 14/976,311

(22) Filed: Dec. 21, 2015

(65) Prior Publication Data

US 2017/0077942 A1 Mar. 16, 2017

(30) Foreign Application Priority Data

| Sep. 14, 2015 | (PL) | 413961 |
| Sep. 14, 2015 | (PL) | 413962 |
| Sep. 14, 2015 | (PL) | 413963 |
| Sep. 14, 2015 | (PL) | 413967 |

(51) Int. Cl.
   $H03M\ 1/38$  (2006.01)
(52) U.S. Cl.
   CPC ................ $H03M\ 1/38$ (2013.01)
(58) Field of Classification Search
   CPC ............... H03M 1/00; H03M 1/38
   USPC ............................ 341/161, 172, 155
   See application file for complete search history.

(56) References Cited

U.S. PATENT DOCUMENTS

| 5,019,906 | A * | 5/1991 | Wesolowski | H04N 17/06 348/497 |
| 7,095,035 | B2 * | 8/2006 | Nishimura | B82Y 10/00 250/307 |
| 7,876,254 | B2 * | 1/2011 | Berens | H03M 1/0682 341/144 |
| 8,358,216 | B2 * | 1/2013 | Du | G01F 23/263 340/612 |
| 2013/0176157 | A1 * | 7/2013 | Koscielnik | H03M 1/14 341/155 |
| 2014/0062741 | A1 * | 3/2014 | Nakanishi | H03M 1/0827 341/122 |

* cited by examiner

*Primary Examiner* — Jean B Jeanglaude
(74) *Attorney, Agent, or Firm* — Ladas & Parry LLP

(57) ABSTRACT

A method for indirect conversion of a voltage value to a digital word consisting in sampling an input voltage through a parallel connection of a sampling capacitor to a source of the input voltage, and next in mapping a sample value of the input voltage to a time interval, and in assignment of a corresponding value of n-bit output digital word by the use a control module characterized in that the time interval is mapped to a difference of a length of a reference time and a length of a signal time, while the reference time is generated from an instant when the beginning of the time interval is detected by the use the control module, and the signal time is generated from an instant when the end of the time interval is detected by the use the control module, whereas generation of the reference time and the signal time is terminated at the same instant.

16 Claims, 3 Drawing Sheets

METHOD AND APPARATUS FOR INDIRECT CONVERSION OF VOLTAGE VALUE TO DIGITAL WORD

The application claims priority to Polish Patent Application No. P413961, filed Sep. 14, 2015, Polish Patent Application No. P413962, filed Sep. 14, 2015, Polish Patent Application No. P413963, filed Sep. 14, 2015, and Polish Patent Application No. P413967, filed Sep. 14, 2015, all of which are incorporated herein by reference.

BACKGROUND OF THE INVENTION

The subject of this invention is a method and an apparatus for indirect conversion of a voltage value to a digital word that can be applied in monitoring and control systems.

A method for indirect conversion of a voltage value to a digital word is known from the article G. Smarandoiu, K. Fukahori, P. R. Gray, D. A. Hodges "An All-MOS Analog-to-Digital Converter Using a Constant Slope Approach", IEEE Journal of Solid-State Circuits, Volume: 11, Issue: 3, 1976, str. 408-:-410. An input voltage is sampled first. Charge accumulated in a sampling capacitor is further removed bz the use of a current source of a fixed intensity. Thus, time needed to discharged the sampling capacitor is directly proportional to a value of the input voltage. A conversion of a capacitor discharge time to a digital number is realized by counting of reference clock periods.

A method for indirect conversion of a voltage value to a digital word is also known from the patent document U.S. Pat. No. 8,928,516 consists in mapping of a voltage value to a proportional charge portion. The charge portion is accumulated in a sampling capacitor by a parallel connection of the sampling capacitor to a source of an input voltage during active state of a trigger input. Next, the portion of electric charge is converted to the digital word by its redistribution from the sampling capacitor to a set of capacitors of binary-weighted capacitances. Each capacitor corresponds to a bit in output digital word. In each step of the second stage of conversion, the redistribution is realized by charge transfer between two capacitors. A capacitor that is actually a source of charge is called a current source capacitor. A capacitor that actually collects charge is called a current destination capacitor. The current destination capacitor has always lower capacitance than the current source capacitor. Moving the charge results in growing the voltage on the current destination capacitor and at the same time in falling the voltage on the current source capacitor. If the voltage on the current destination capacitor reaches the reference voltage before the voltage on the current source capacitor falls to zero, then, in the next conversion step, the charge transfer is continued to a new destination capacitor whose capacitance is twice lower than a capacitance of the current destination capacitor. If the voltage on the current source capacitor falls to zero before the current destination capacitor reaches the reference voltage, then, in the next conversion step, the current destination capacitor becomes a new source capacitor, and a new destination capacitor has a capacitance twice lower than a capacitance of the current destination capacitor. If a voltage on a particular capacitor equals the reference voltage, then a value one is assigned to a bit in the output digital word corresponding to this capacitor, and a value zero is assigned to other bits.

An apparatus for indirect conversion of a voltage value to a digital word is known from the article H. Amemiya, T. Yoneyama "Integrating Analog-to-Digital Converter with Digital Self-Calibration", IEEE Transactions on Instrumentation and Measurement, Volume IM-25, Issue 2, 1976, str. 132-138. An input voltage is provided to a first stationary contact of a change-over switch, whose second stationary contact is connected to a source of a reference voltage. A moving contact of this change-over switch is connected to an input of an integrator, whose output is connected to a first input of a comparator. A second input of a comparator is connected to a source of a threshold voltage, and an output of the comparator is connected to a first input of control logic comprising a digital counter. A second input of control logic is connected to an output of a reference generator. Besides, control logic is equipped with a digital output and control output connected to a control input of the change-over switch.

An apparatus for indirect conversion of a voltage value to a digital word known from the patent document U.S. Pat. No. 8,928,516 comprises a sampling capacitor and a set of capacitors of binary-weighted capacitances. A top plate of the sampling capacitor is connected to a source of input voltage through an on-off input switch, whose control input is connected to a control output of a control module. A bottom plate of each capacitor is connected through a change-over switch to the ground of the circuit, or to a source of auxiliary voltage, while a value of auxiliary voltage is higher enough than a value of a reference voltage. A non-inverting input of a first comparator is also connected to the source of auxiliary voltage. The first comparator is used to detect that a source capacitor is completely discharged. The inverting input of the first comparator is connected to a source rail. A non-inverting input of a second comparator is connected to the source of reference voltage, and an inverting input of the second comparator is connected to a destination rail. The second comparator is used to detect that a voltage on a destination capacitor reaches the reference voltage. The destination rail is connected through an on-off switch to the ground of the circuit and to an output of a current source whose input is connected through a change-over switch to the source rail or to a source of supply voltage. A top plate of each capacitor is connected through a source on-off switch to the source rail, and a destination on-off switch to the destination rail. Control inputs of the change-over switches and on-off switches are connected to relevant control outputs of a control module. A destination on-off switch corresponding to a given capacitor is controlled by the same control output of the control module, while a source on-off switch is controlled by another control output of the control module. Outputs of both comparators and a time input are also connected to the control module. Besides, the control module comprises a digital output and a complete conversion output.

SUMMARY OF THE INVENTION

Method for indirect conversion of time interval to digital word, according to the invention, consists in sampling an input voltage through a parallel connection of a sampling capacitor to a source of the input voltage, and next in mapping of a sample value of the input voltage to a time interval, and in assignment of a corresponding value of n-bit output digital word by the use a control module.

The essence of the invention is that the time interval is mapped to a difference of a length of a reference time and a length of a signal time. The reference time is generated by the use the control module from an instant of a beginning of the time interval, and the signal time is generated by the use the control module from an instant of a termination of the time interval. The generation of the reference time and the signal time is terminated at the same instant.

It is advantageous if generation of the reference time is realized by charging a capacitor using a reference current source, while this capacitor is selected by the use of the control module from a set of capacitors comprising capacitors, such that a capacitance of a capacitor of a given index is twice as high as a capacitance of a capacitor of the previous index. A capacitor of the highest capacitance in the set of capacitors is selected first. A selected capacitor is charged as long as the reference voltage increasing on the selected capacitor and compared to the threshold voltage by the use of the reference comparator equals the threshold voltage. Then a next capacitor in the set of capacitors is started to be charged while this capacitor has the highest capacitance among the capacitors that have not been charged yet. The reference voltage increasing on this capacitor being charged is compared to the threshold voltage by the use of the reference comparator, and the cycle is repeated to the end of generation of both time intervals.

The generation of the signal time is realized by charging a capacitor by the use of the signal current source, while this capacitor selected by the use of the control module from a set of capacitors has the highest capacitance among the capacitors that have not been charged yet. The selected capacitor is charged as long as the signal voltage increasing on this capacitor and compared to the threshold voltage by the use of the signal comparator equals the threshold voltage. Then, a next capacitor in the set of capacitors is started to be charged by the use of the signal current source while this capacitor is selected in the same way and the cycle is repeated to the end of generation of both time intervals.

The generation of the reference time and of the signal time is terminated while the capacitor of the lowest capacitance in the set of capacitors is charged, and when the reference voltage increasing on a capacitor charged by the use of the reference current source, or when the signal voltage increasing on a capacitor charged by the use of the signal current source equals the threshold voltage.

It is advantageous if the generation of the time interval by the use of the control module is terminated when a voltage increasing on a sampling capacitor in a sampling module, which is compared to the threshold voltage by the use of the reference comparator equals the threshold voltage.

It is advantageous if a value of n-bit output digital word as a conversion result is determined by the use of the control module such that the control module assigns a value one to the least significant bit in this digital word if a voltage on the last capacitor charged by the use of the reference current source reached the threshold voltage. The control module assigns a value one to a bit of n-bit output digital word if a capacitor in the set of capacitors has been charged by the use of the signal current source, and the control module assigns a value zero to a bit otherwise.

It is advantageous if the generation of a time interval by the use of the control module is terminated when a voltage decreasing on the sampling capacitor in the sampling module observed by the use of the signal comparator equals zero.

It is advantageous if a value of n-bit output digital word which is a conversion result is evaluated by the use of the control module in the following way. The control module assigns a value one to a bit in this digital word if in case a capacitor corresponding to the bit in the set of capacitors is charged by the use of the reference current source, a next capacitor is not started to be charged by the use of the signal current source during a time when a capacitor is charged by the use of the reference current source. The control module assigns also a value one to a bit in this digital word if in case a capacitor corresponding to the bit in the set of capacitors is charged by the use of the signal current source, a next capacitor is started to be charged by the use of the reference current source during a time when a capacitor is charged by the use of the signal current source. The control module assigns a value zero to the bit otherwise.

It is advantageous if intensity of the signal current source is lower than intensity of the reference current source during the time interval, and intensity of the signal current source is increased by the use of the control module to intensity of the reference current source at the instant when generation of the time interval is terminated by the use of the control module.

Apparatus for indirect conversion of time interval to digital word, according to the invention, comprises a control module having a trigger input, an output digital word, a complete conversion output, a reference input connected to a reference comparator output, a signal input connected to a signal comparator output, a reference output connected to a control input of a reference current source, a signal output connected to a control input of a signal current source, a sampling output connected to a control input of the sampling module, and control outputs of change-over switches of a set of capacitors. A capacitance value of a capacitor of a given index is twice as high as a capacitance value of the capacitor of the previous index. A non-inverting input of the reference comparator is connected to a reference rail and to an output of the reference current source, whose input is connected to a source of a voltage supply. An inverting input of the reference comparator is connected to a source of a threshold voltage. The sampling module comprises the sampling capacitor and is connected to the signal rail and to the output of the signal current source, and is equipped with a voltage input.

The essence of the apparatus, according to the invention, consists in that a non-inverting input of the signal comparator is connected to the signal rail and to the output of the signal current source whose input is connected to the source of the voltage supply. The inverting input of the signal comparator is connected to the source of the threshold voltage and to the inverting input of the reference comparator. Bottom plates of capacitors of the set of capacitors are connected to a ground of a circuit, and top plates of capacitors are connected respectively to moving contacts of change-over switches. First stationary contacts of the change-over switches are connected to the signal rail, second stationary contacts are connected to the ground of the circuit, and third stationary contacts are connected to the reference rail.

It is advantageous if a top plate of a sampling capacitor in a sampling module is connected to a moving contact of a change-over switch of a top plate whose first stationary contact is connected to an input of a source of input voltage, and whose second stationary contact is connected to the signal rail, A bottom plate of the sampling capacitor in the sampling module is connected to the ground of the circuit, and a control input of the change-over switch of the top plate is connected to a sampling output of the control module.

It is advantageous if the top plate of the sampling capacitor in the sampling module is connected to the moving contact of the change-over switch of the top plate whose first stationary contact is connected to the input In of the source of input voltage, and whose second stationary contact is connected to the source of the threshold voltage. The bottom plate of the sampling capacitor in the sampling module is connected to a moving contact of a change-over switch of a bottom plate, whose first stationary contact is connected to the ground of the circuit, and second stationary contact is connected to the signal rail. A control input of the change-over switch of the top plate and a control input of the change-over switch of the bottom plate coupled together are connected to the sampling output of the control module.

It is advantageous if the signal current source and the reference current source have the same intensity, while a capacitance of the sampling capacitor in the sampling module is twice as high as a capacitance of the capacitor having the highest capacitance in the set of capacitors.

It is advantageous if the intensity of the signal current source is controllable, and equals intensity of the reference current source or is p times lower than intensity of the reference current source, while the capacitance of the sampling capacitor is p times lower than a double capacitance of the capacitor having the highest capacitance in the set of capacitors.

The advantage of the solution consists in that the operation of the apparatus is timed by two comparators which detect instants when particular conversion stages are completed. In this way a need of using an external source of timing signal that consumes considerable amount of energy is eliminated. Thereby, energy efficiency of conversion is improved.

High energy efficiency of method and apparatus, according to the invention, results also from the idle operation between conversion cycles because the solution consumes then less power if it is implemented in CMOS technology.

The permanent connection of bottom plates of all capacitors in a set of capacitors limits influence of parasitic capacitances on conversion accuracy, reduces a number of switches, and simplifies control of its operation.

In the sampling module according to the first embodiment, a bottom plate of a sampling capacitor is connected permanently to a ground of the circuit. In this way, an influence of parasitic capaciatnces on the conversion accuracy is limited.

The use of the reference current source with controlled intensity enables a decrease of a required sampling capacitor capacitance, which reduces a die area of a chip implementing the converter according to the invention.

BRIEF DESCRIPTION OF THE DRAWINGS

The solution, according to the invention, is presented in the following figures.

DESCRIPTION OF THE PREFERRED EMBODIMENTS

Figure 4:
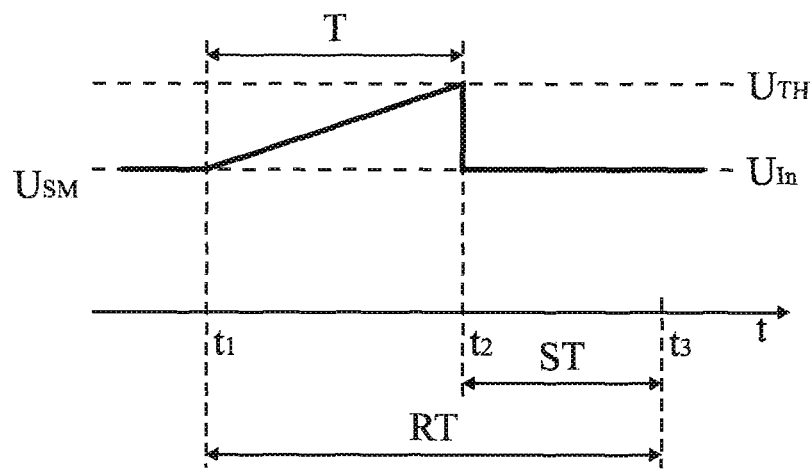
FIG. 4 illustrates relationship between the generation of the time interval T and the voltage $U_{SM}$ on the sampling capacitor $C_n$ of the sampling module SM in the first embodiment.

Method for indirect conversion of voltage value to digital word, according to the invention, in the first embodiment consists in translation of a value of the input voltage to a time interval, and in mapping the time interval to a difference of a length of a reference time RT and a length of a signal time ST (FIG. 4). The input voltage is sampled through a parallel connection of a top plate of sampling capacitor $C_n$ to an input In of the input voltage $U_{in}$.

As soon as a control module CM detects a beginning of an active state on a trigger input Trg, the top plate of sampling capacitor $C_n$ of the sampling module SM is connected to an output of a signal current source $I_S$ and starts a generation of the time interval T by the use of the control module CM. The voltage $U_{SM}$ on the sampling capacitor $C_n$ of the sampling module SM charged by the use of the signal current source $I_S$ grows starting from the value of the input voltage $U_{In}$. The generation of the time interval T by the use of the control module CM is terminated when the voltage $U_{SM}$ on the sampling capacitor $C_n$ of the sampling module SM which is compared to the threshold voltage $U_{TH}$ by the use of the signal comparator $K_S$, equals the threshold voltage $U_{TH}$ (FIG. 4).

The reference time RT is generated from an instant $t_1$ when the beginning of the time interval T is detected by the use the control module CM (FIG. 4). The signal time ST is generated from an instant $t_2$ when the end of the time interval T is detected by the use the control module CM (FIG. 4). The generation of the reference time RT and the signal time ST is terminated at the same instant $t_3$ when each capacitor in the set of capacitors was charged (FIG. 4).

The generation of the reference time RT is realized by charging a capacitor using a reference current source $I_R$. This capacitor is selected by the use of the control module CM from a set of capacitors CS comprising capacitors $C_{n-1}$, $C_{n-2}$, ..., $C_1$, $C_0$. The capacitor $C_{n-1}$ of the highest capacitance in the set of capacitors CS is selected first. A selected capacitor is charged as long as the reference voltage $U_R$ increasing on the selected capacitor and compared to the threshold voltage $U_{TH}$ by the use of the reference comparator $K_R$ reaches the threshold voltage $U_{TH}$. Then, a next capacitor in the set of capacitors CS is started to be charged while this capacitor has the highest capacitance among the capacitors that have not been charged yet, and the reference voltage $U_R$ increasing on this capacitor being charged is compared to the threshold voltage $U_{TH}$ by the use of the reference comparator $K_R$. The cycle is repeated until all the capacitors $C_{n-1}$, $C_{n-2}$, ..., $C_1$, $C_0$ are charged.

The generation of the signal time ST is realized by charging a capacitor by the use of the signal current source $I_S$. This capacitor selected by the use of the control module CM from a set of capacitors CS has the highest capacitance among the capacitors that have not been charged yet. The selected capacitor is charged as long as the signal voltage $U_S$ increasing on this capacitor and compared to the threshold voltage $U_{TH}$ by the use of the signal comparator $K_S$ equals the threshold voltage $U_{TH}$. Then, a next capacitor in the set of capacitors CS is started to be charged by the use of the signal current source $I_S$, while this capacitor is selected in the same way. The cycle is repeated until all the capacitors $C_{n-1}$, $C_{n-2}$, ..., $C_1$, $C_0$ are charged. The generation of the reference time RT and the generation of the signal time ST are terminated during the time when the capacitor $C_0$ of the lowest capacitance in the set of capacitors CS is charged, and when the reference voltage $U_R$ increasing on a capacitor charged by the use of the reference current source $I_R$, or when the signal voltage $U_R$ increasing on a capacitor charged by the use of the signal current source $I_S$ reaches the threshold voltage $U_{TH}$.

A binary value represented by n-bit output digital word B being a conversion result is determined by the use of the control module CM such that the control module CM assigns a value one to the least significant bit $b_0$ in this digital word if a voltage on the last capacitor charged by the use of the reference current source $I_R$ reached the threshold voltage $U_{TH}$, while the control module CM assigns a value one to a bit $b_j$ of n-bit output digital word B if a capacitor $C_{j-1}$ in the set of capacitors CS has been charged by the use of the signal current source $I_S$, and the control module CM assigns a value zero to a bit $b_j$ otherwise.

Figure 5:
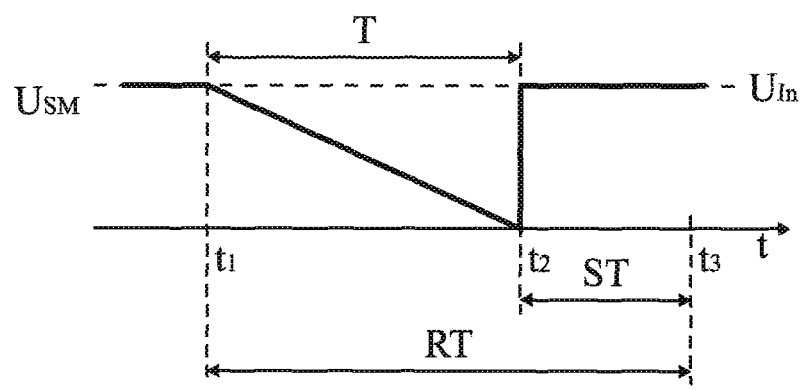
FIG. 5 illustrates relationship between the generation of the time interval T and the voltage $U_{SM}$ on the sampling capacitor $C_n$ of the sampling module SM in the second embodiment.

Method for indirect conversion of voltage value to digital word, according to the invention, in the second embodiment differs from aforementioned method in the first embodiment in that as soon as a control module CM detects a beginning of an active state on a trigger input Trg, the top plate of sampling capacitor $C_n$ of the sampling module SM is connected to the threshold voltage, while the bottom plate of sampling capacitor $C_n$ is connected to the output of a signal current source $I_S$. The voltage $U_{SM}$ on the sampling capacitor $C_n$ of the sampling module SM charged by the use of the signal current source $I_S$ decreases starting from the value of the input voltage $U_{In}$ (FIG. 5). The generation of the time interval T by the use of the control module CM is terminated when the voltage $U_{SM}$ on the sampling capacitor $C_n$ of the sampling module SM which is compared to the threshold voltage $U_{TH}$ by the use of the signal comparator $K_S$, equals zero (FIG. 5).

In the second embodiment, according to the invention, a binary value represented by the n-bit output digital word B, being a conversion result, is evaluated by the use of the control module CM such that the control module CM assigns a value one to a bit $b_j$ in this digital word if a next capacitor $C_{j-1}$ is not started to be charged by the use of the signal current source $I_S$ during a time when a capacitor $C_j$ corresponding to the bit $b_j$ in the set of capacitors CS is charged by the use of the reference current source $I_R$, or a next capacitor $C_{j-1}$ is started to be charged by the use of the reference current source $I_R$ during a time when a capacitor $C_j$ is charged by the use of the signal current source $I_S$. On the other hand, the control module CM assigns a value zero to the bit $b_j$ otherwise.

Method for indirect conversion of voltage value to digital word, according to the invention, in another embodiment differs from aforementioned embodiments in that intensity of the signal current source $I_S$ is eight times lower than intensity of the reference current source $I_R$ during the time interval T. Intensity of the signal current source $I_S$ is increased by the use of the control module CM to intensity of the reference current source $I_R$ at the instant $t_2$ when generation of the time interval T is terminated by the use of the control module CM.

Figure 1:
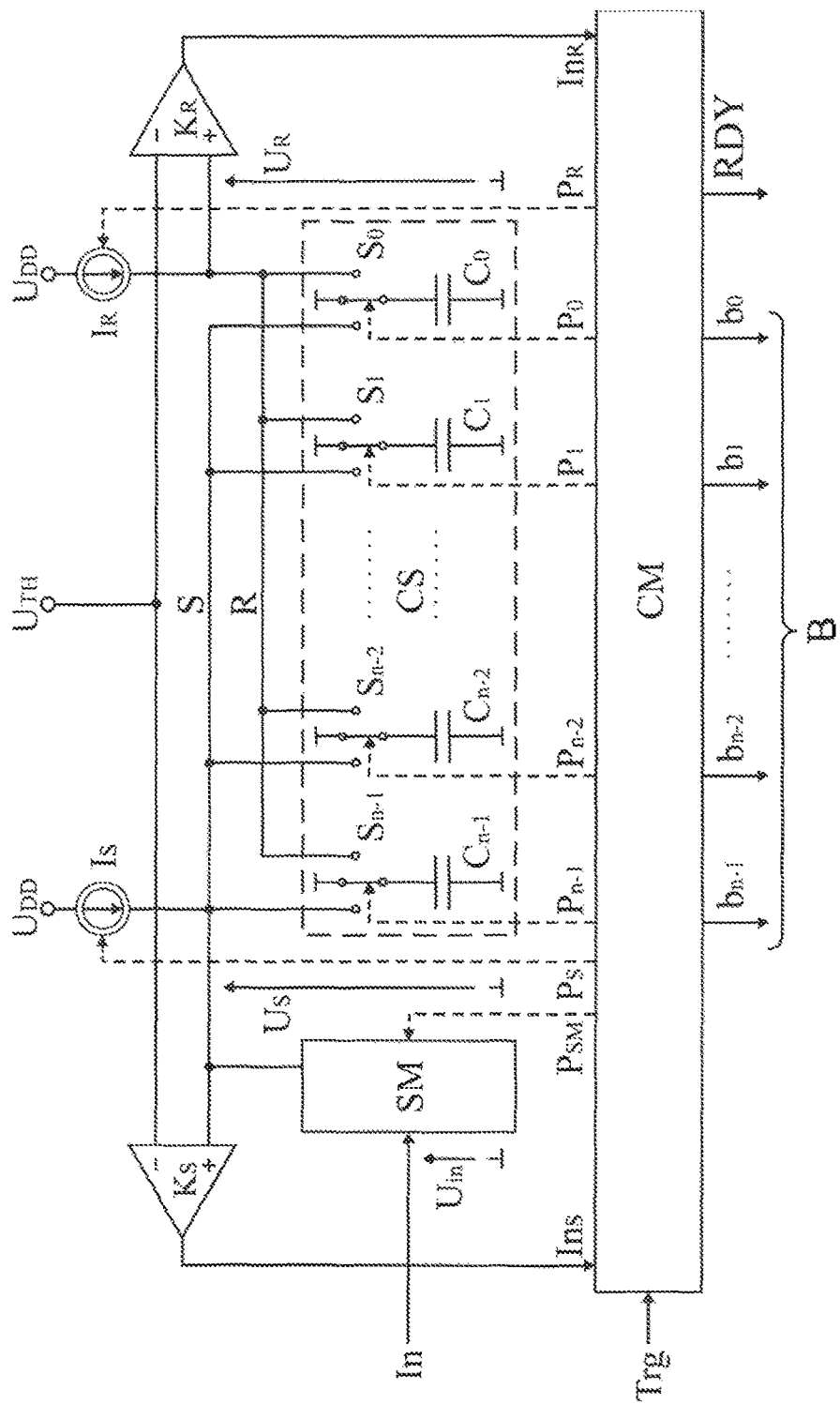
FIG. 1 illustrates the apparatus in the sampling mode.

In the first embodiment, an apparatus for indirect conversion of a voltage value to a digital word using a successive approximation scheme, according to the invention, comprises a control module CM having a trigger input Trg, a digital output B, and a complete conversion output RDY (FIG. 1). A reference input $In_R$ of the control module CM is connected to an output of a reference comparator $K_R$, and a signal input $In_S$ of the control module CM is connected to an output of a signal comparator $K_S$. A reference output $P_R$ of the control module CM is connected to a control input of a reference current source $I_R$, and a signal output $P_S$ of the control module CM is connected to a control input of a signal current source $I_S$.

A sampling output $P_{SM}$ of the control module CM is connected to a control input of the sampling module SM. Control outputs $P_{n-1}, P_{n-2}, \ldots, P_1, P_0$ of the control module CM are connected respectively to control inputs of change-over switches $S_{n-1}, S_{n-2}, \ldots, S_1, S_0$ of a set of capacitors CS.

A capacitance value of each capacitor $C_{n-1}, C_{n-2}, \ldots, C_1, C_0$ of a given index in the set of capacitors CS is twice as high as a capacitance value of the capacitor of the previous index. A non-inverting input of the reference comparator $K_R$ is connected to a reference rail R and to an output of the reference current source $I_R$, whose input is connected to a source of a voltage supply $U_{DD}$. An inverting input of the reference comparator $K_R$ is connected to a source of a threshold voltage $U_{TH}$. A non-inverting input of the signal comparator $K_S$ is connected to the signal rail S and to the output of the signal current source $I_S$ whose input is connected to the source of the voltage supply $U_{DD}$. The inverting input of the signal comparator $K_S$ is connected to the source of the threshold voltage $U_{TH}$ and to the inverting input of the reference comparator $K_R$. Bottom plates of capacitors $C_{n-1}, C_{n-2}, \ldots, C_1, C_0$ of the set of capacitors CS are connected to a ground of a circuit, and top plates of the capacitors $C_{n-1}, C_{n-2}, \ldots, C_1, C_0$ are connected respectively to moving contacts of change-over switches $S_{n-1}, S_{n-2}, \ldots, S_1, S_0$. First stationary contacts of the change-over switches $S_{n-1}, S_{n-2}, \ldots, S_1, S_0$ are connected to the signal rail S, second stationary contacts are connected to the ground of the circuit, and third stationary contacts are connected to the reference rail R. The signal current source $I_S$ and the reference current source $I_R$ have the same intensity in the first embodiment.

Figure 2:
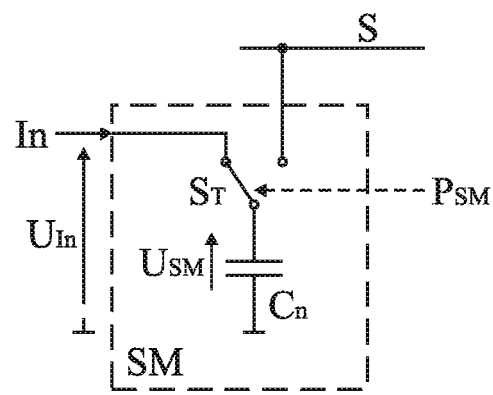
FIG. 2 illustrates the first embodiment of the sampling module SM.

The sampling module SM comprises the sampling capacitor $C_n$, whose capacitance is twice higher than a capacitance of the capacitor $C_{n-1}$ having the highest capacitance in the set of capacitors. A top plate of a sampling capacitor $C_n$ in a sampling module SM is connected to a moving contact of a change-over switch of a top plate $S_T$ whose first stationary contact is connected to an input In of a source of input voltage $U_{In}$, and whose second stationary contact is connected to the signal rail S (FIG. 2). A bottom plate of the sampling capacitor $C_n$ in the sampling module SM is connected to the ground of the circuit, and a control input of the change-over switch of the top plate $S_T$ is connected to a sampling output $P_{SM}$ of the control module CM.

Figure 3:
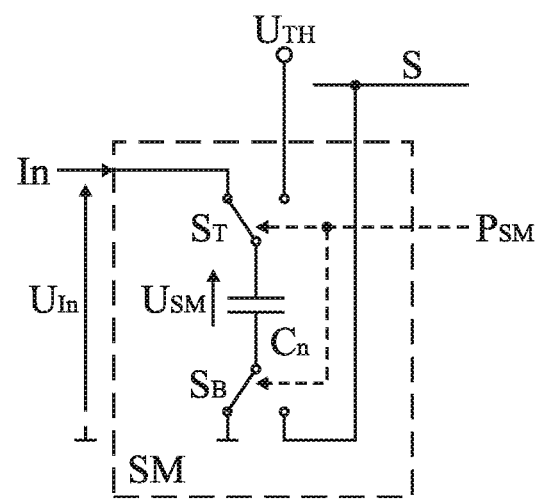
FIG. 3 illustrates the second embodiment of the sampling module SM.

An apparatus in the second embodiment differs from the apparatus in the first embodiment in that a second moving contact of a change-over switch of a top plate $S_T$ is connected to the threshold voltage $U_{TH}$ (FIG. 3). Besides, a bottom plate of the sampling capacitor $C_n$ in the sampling module SM is connected to a moving contact of the change-over switch of the bottom plate $S_B$ whose first stationary contact is connected to a ground of the circuit, and second stationary contact is connected to the signal rail S. A control input of the change-over switch of the bottom plate $S_B$ is connected to the sampling output $P_{SM}$ of the control module CM.

An apparatus in another embodiment differs from aforementioned embodiments in that intensity of the signal current source $I_S$ is controllable, and controlled through a reference output $P_R$ by the control module CM. Intensity of the signal current source $I_S$ might be equal to or eight times lower than intensity of the reference current source $I_R$. Besides, the capacitance of the sampling capacitor $C_n$ in the sampling module SM is four times lower than the capacitance of the capacitor $C_{n-1}$ having the highest capacitance in the set of capacitors CS.

The description below includes the following symbols:

x is an index of a capacitor actually charged by the use of the reference current source $I_R$, y is an index of a capacitor actually charged by the use of the signal current source $I_S$, Z is an index of a capacitor having the highest capacitance among the capacitors in the set of capacitors that have not been charged yet.

The indirect conversion of a voltage value to a digital word using a successive approximation scheme, according to the invention, in the first embodiment is realized as follows (FIG. 1).

Before the start of the process of conversion, the control module CM causes the switching off the reference current source $I_R$ by the use of the signal from the reference output $P_R$, and also the switching off the signal current source $I_S$ by the use of the signal from the signal output $P_S$. Additionally, by the use of signals from the control outputs $P_{n-1}$, $P_{n-2}$, ..., $P_1$, $P_0$, the control module CM causes the switching of change-over switches $S_{n-1}$, $S_{n-2}$, ..., $S_1$, $S_0$ and the connection of the top plates of the capacitors $C_{n-1}$, $C_{n-2}$, ..., $C_1$, $C_0$ in the set of capacitors CS to the ground of the circuit enforcing a complete discharge of all the capacitors $C_{n-1}$, $C_{n-2}$, ..., $C_1$, $C_0$ in the set of capacitors CS. By the use of a control signal from the sampling output $P_{SM}$, the control module CM causes the switching of the change-over switch of a top plate $S_T$ to a first position, and the connection of the top plate of the sampling capacitor $C_n$ of the sampling module SM to the input In of the input voltage $U_{in}$, which introduces the sampling module SM to the sampling mode (FIG. 2).

At the instant, when the control module CM detects the beginning of an active state on the trigger input Trg, the control module CM introduces the complete conversion output RDY to an inactive state. Next, the control module CM terminates the sampling of the input voltage $U_{In}$ and starts generation of the reference time RT (FIG. 4). The control module CM causes then the connection of the top plate of the sampling capacitor $C_n$ of the sampling module SM to the output of the signal current source $I_S$. Therefore, the control module CM causes by the use of the control signal from the sampling output $P_{SM}$ the switching of the change-over switch of a top plate $S_T$ to a second position. At the same time, by the use of the signal from the signal output $P_S$, the control module CM causes the switching on the signal current source $I_{Ss}$. The voltage $U_{SM}$ on the sampling capacitor $C_n$ of the sampling module SM charged by the signal current source $I_S$ grows starting from the sample value of the input voltage $U_{In}$ (FIG. 4). The voltage $U_{SM}$ is compared by the signal comparator $K_S$ to the threshold voltage $U_{TH}$.

Next, the control module CM starts generation of the reference time RT (FIG. 4). Then, by the use of the signal from the control output $P_{n-1}$, the control module CM causes the switching of the change-over switch $S_{n-1}$ and the connection of an output of the reference current source $I_R$ to the top plate of the capacitor $C_{n-1}$ having the highest capacitance in the set of capacitors CS. At the same time, by the use of the signal from the reference output $P_R$, the control module CM causes the switching on the reference current source $I_R$. Next, the control module assigns a value one to a bit $b_{n-1}$ of the first n-bit digital word, and a value zero to a bit $b_{n-1}$ of the second n-bit digital word. The reference voltage $U_R$ increasing on a capacitor $C_X$ charged by the use of the reference current source $I_R$ is compared to the threshold voltage $U_{TH}$ by the use of the reference comparator $K_R$. When the reference voltage $U_R$ on the capacitor $C_X$ reaches the threshold voltage $U_{TH}$, then, on the basis of the output signal of the reference comparator $K_R$, the control module CM by the use of the signal from the control output $P_X$ causes the switching of the change-over switch $S_X$ and the connection of the top plate of the capacitor $C_X$ to the ground of the circuit enforcing a complete discharge of this capacitor. At the same time, the control module CM by the use of the signal from the control output $P_z$ causes the switching of the change-over switch $S_z$ and the connection of the output of the reference current source $I_R$ to the top plate of the capacitor $C_z$ such that it has the highest capacitance among the capacitors CS in the set of capacitors that have not been charged yet. Next, the control module CM assigns a value zero to the bit $b_{z+1}$ in the n-bit digital word.

The reference voltage $U_R$ increasing on a capacitor $C_X$ charged by the use of the reference current source $I_R$ is compared to the threshold voltage $U_{TH}$ by the use of the reference comparator $K_R$. The cycle is repeated until the generation of the reference time RT is terminated at the same instant $t_3$.

At the instant, when the control module CM detects on the basis of the output signal of the signal comparator $K_{Ss}$, that the voltage $U_{SM}$ increasing on the sampling capacitor $C_n$ of the sampling module SM reaches the threshold voltage $U_{TH}$, the control module CM terminates the generation of the time interval T (FIG. 4).

By the use of a control signal from the sampling output $P_{SM}$, the control module CM causes the switching of the change-over switch of a top plate $S_T$ to a first position, and the connection of the top plate of the sampling capacitor $C_n$ of the sampling module SM to the input In of the input voltage $U_{In}$, which introduces the sampling module SM again to the sampling mode (FIG. 2).

Next, the control module CM starts to generate the signal time ST (FIG. 4). Then, by the use of the signal from the control output $P_z$, the control module CM causes the switching of the change-over switch $S_z$ and the connection of an output of the signal current source $I_S$ to the top plate of the capacitor $C_z$ such that it has the highest capacitance among the capacitors CS in the set of capacitors that have not been charged yet. By the use of a control signal from the sampling output $P_{SM}$, the control module CM causes the switching of the change-over switch of a top plate $S_T$ to a first position, and the connection of the top plate of the sampling capacitor $C_n$ of the sampling module SM to the input In of the input voltage $U_{In}$, which introduces the sampling module SM to the sampling mode (FIG. 2).

Next, the control module CM starts generation of the signal time ST (FIG. 4).

Then, by the use of the signal from the control output $P_z$, the control module CM causes the switching of the change-over switch $S_z$ and the connection of an output of the signal current source $I_S$ to the top plate of the capacitor $C_z$ such that it has the highest capacitance among the capacitors CS in the set of capacitors that have not been charged yet. Next, the control module CM assigns a value one to a bit $b_{z+1}$ of the n-bit digital word.

The signal voltage $U_S$ increasing on a capacitor $C_y$ charged by the use of the signal current source $I_S$ is compared to the threshold voltage $U_{TH}$ by the use of the signal comparator $K_S$. When the signal voltage $U_S$ equals the threshold voltage $U_{TH}$, then, on the basis of the output signal of the reference signal $K_S$, the control module CM by the use of the signal from the control output $P_y$ causes the switching of the change-over switch $S_y$ and the connection of the top plate of the capacitor $C_y$ to the ground of the circuit enforcing a complete discharge of this capacitor. At the same time, the control module CM by the use of the signal from the control output $P_z$ causes the switching of the change-over switch S, and the connection of the output of the signal current source $I_S$ to the top plate of the capacitor $C_z$ such that it has the highest capacitance among the capacitors CS in the set of capacitors that have not been charged yet. The cycle is repeated until generation of the signal time ST is terminated at the same instant $t_3$.

The generation of the reference time RT and the generation of the signal time ST are terminated by the control module CM at the instant $t_3$ (FIG. 4) when the capacitor $C_0$ of the lowest capacitance in the set of capacitors CS is charged, and when the control module CM on the basis of the output signal of the reference comparator $K_R$ detects that the reference voltage $U_R$ increasing on a capacitor $C_X$ charged by the use of the reference current source $I_R$ equals the threshold voltage $U_{TH}$, or when the control module CM on the basis of the output signal of the source comparator $K_S$ detects that the signal voltage $U_S$ increasing on a capacitor $C_y$ charged by the use of the signal current source $I_S$ equals the threshold voltage $U_{TH}$.

In the former case, the value zero is assigned to the least significant bit $b_0$ in the digital word B, while in the latter case, the value one is assigned to the least significant bit $b_0$ by use of the control module CM.

Next, in both cases, the control module CM by the use of the signal from the reference output $P_R$ causes the switching off the reference current source $I_R$ and by the use of the signal from the signal output $P_S$ causes the switching off the signal current source $I_S$. Additionally, by the use of the signal from the control outputs $P_{n-1}, P_{n-2}, \ldots, P_1, P_0$, the control module CM causes the switching of the change-over switches $S_{n-1}, S_{n-2}, \ldots, S_1, S_0$ and the connection of the top plates of all the capacitors $C_{n-1}, C_{n-2}, \ldots, C_1, C_0$ to the ground of the circuit enforcing a complete discharge of all the capacitors $C_{n-1}, C_{n-2}, \ldots, C_1, C_0$ in the set of capacitors CS (FIG. 1). Next, the control module CM introduces the complete conversion output RDY to an active state.

When the control module CM on the basis of the output signal from the signal comparator $K_S$ detects that the voltage $U_{SM}$ increasing on the sampling capacitor $C_n$ of the sampling module SM reaches the threshold voltage $U_{TH}$, the control module CM terminates the generation of the time interval T (FIG. 4).

In the second embodiment, the indirect conversion of the voltage value to the digital word differs from the indirect conversion in the first embodiment in that before starting the conversion, the control module CM on the basis of the control signal from the sampling output $P_{SM}$ causes additionally the switching of the change-over switch of the bottom plate $S_B$ into the first position and the connection of the bottom plate of the sampling capacitor $C_n$ in the sampling module SM to a ground of the circuit (FIG. 3).

At the instant, when the control module CM detects the beginning of an active state on the trigger input Trg, the control module CM causes the connection of the top plate of the sampling capacitor $C_n$ of the sampling module SM to the threshold voltage $U_{TH}$, and the connection of the bottom plate of the sampling capacitor $C_n$ to the output of the signal current source $I_S$. Therefore, the control module CM causes by the use of the control signal from the sampling output $P_{SM}$ the switching of the change-over switch of the top plate $S_T$ to the second position, and the switching of the change-over switch of the bottom plate $S_B$ to the second position. The voltage $U_{SM}$ on the sampling capacitor $C_n$ of the sampling module SM charged by the signal current source $I_S$ decreases starting from the sample value of the input voltage $U_{In}$. The voltage $U_{SM}$ is controlled by the signal comparator $K_S$.

When the control module CM on the basis of the output signal from the signal comparator $K_S$ detects that the voltage $U_{SM}$ decreasing on the sampling capacitor $C_n$ of the sampling module SM reaches zero (FIG. 5), the control module CM by the use of the control signal from the sampling output $P_{SM}$ causes the switching of the change-over switch of the bottom plate $S_B$ to the first position, and the connection of the bottom plate of the sampling capacitor $C_n$ of the sampling module SM to a ground of the circuit (FIG. 3).

In the other embodiment of the apparatus, at the instant of detection the beginning of the active state on the trigger input Trg, the control module using the signal from the signal output $P_S$ causes additionally a decrease of intensity of the signal current source $I_S$ by eight times compared to intensity of the signal current source $I_R$. At the instant $t_2$, when the generation of the time interval T is terminated, the contrl module CM by the use of the signal output $P_S$ causes additionally an increase of intensity of the signal current source $I_S$ to intensity of the signal current source $I_R$.

ACRONYMS

In voltage input
$In_S$ signal input
$In_R$ reference input
Trg trigger input
$P_S$ signal output
$P_R$ reference output
$P_{SM}$ sampling output
RDY complete conversion output
B digital output
$b_{n-1}, b_{n-2}, \ldots, b_1, b_0$ bits of digital word
S signal rail
R reference rail
Is signal current source
$I_R$ reference current source
$K_S$ signal comparator
$K_R$ reference comparator
CS set of capacitors
CM control module
SM sampling module
$C_n$ sampling capacitor
$C_{n-1}, C_{n-2}, \ldots, C_1, C_0$ capacitors
$C_{n-1}$ capacitor having the highest capacitance in the set of capacitors
$C_0$ capacitor having the lowest capacitance in the set of capacitors
$S_T$ change-over switch of top plate
$S_B$ change-over switch of bottom plate
$S_{n-1}, S_{n-2}, \ldots, S_1, S_0$ change-over switches
$P_{n-1}, P_{n-2}, \ldots, P_1, P_0$ control outputs
$U_{In}$ input voltage
$U_{SM}$ voltage on sampling capacitor
$U_{TH}$ threshold voltage
$U_S$ signal voltage
$U_R$ reference voltage
$U_{DD}$ supply voltage
T time interval
ST signal time
RT reference time
$t_1$ instant when the beginning of the time interval T is detected
$t_2$ instant when the end of the time interval T is detected
$t_3$ instant when generation of the reference time RT and the signal time ST are terminated

What is claimed is:

1. A method for indirect conversion of a voltage value to a digital word consisting in sampling an input voltage through a parallel connection of a sampling capacitor to a source of the input voltage, and next in mapping a sample value of the input voltage to a time interval, and in assignment of a corresponding value of n-bit output digital word by the use of a control module, wherein the time interval is mapped to a difference of a length of a reference time and a length of a signal time, while the reference time is generated from an instant when the beginning of the time interval is detected by the use of the control module, and the signal time (ST) is generated from an instant when the end of the time interval is detected by the use of the control module, whereas, generation of the reference time and the signal time is are terminated at the same instant.

2. The method according to claim 1, wherein the generation of the time interval by the use of the control module begins at an instant of detection of an active state on a trigger input by the use of the control module, and is realized through charging a sampling capacitor by the use of a signal current source in a sampling module.

3. The method according to claim 2, wherein the generation of the reference time is realized by charging a capacitor by the use of a reference current source, while the capacitor is selected by the use of the control module from a set of capacitors, comprising capacitors, such that a capacitance of a capacitor of a given index is twice as high as a capacitance of a capacitor of the previous index, and the capacitor of the highest capacitance in the set of capacitors is selected first, while a selected capacitor is charged as long as the reference voltage increasing on the selected capacitor and compared to the threshold voltage by the use of the reference comparator equals the threshold voltage, and then a next capacitor in the set of capacitors is started to be charged while this capacitor has the highest capacitance among the capacitors that have not been charged yet, and the reference voltage increasing on this capacitor is compared to the threshold voltage by the use of the reference comparator, and the cycle is repeated, while the generation of the signal time is realized by charging a capacitor by the use of the signal current source while this capacitor selected by the use of the control module from a set of capacitors has the highest capacitance among the capacitors that have not been charged yet, and the selected capacitor is charged as long as the signal voltage increasing on this capacitor and compared to the threshold voltage by the use of the signal comparator equals the threshold voltage, and then a next capacitor in the set of capacitors is started to be charged by the use of the signal current source while this capacitor is selected in the same way and the cycle is repeated, and the generation of the reference time and the generation of the signal time are terminated while the capacitor of the lowest capacitance in the set of capacitors is charged, and when the reference voltage increasing on a capacitor charged by the use of the reference current source, or when the signal voltage increasing on a capacitor charged by the use of the signal current source equals the threshold voltage.

4. The method according to claim 3, wherein the generation of the time interval by the use of the control module is terminated when a voltage increasing on a sampling capacitor in a sampling module, which is compared to the threshold voltage by the use of the reference comparator, reaches the threshold voltage.

5. The method according to claim 4, wherein a binary value represented by n-bit output digital word being a conversion result is determined by the use of the control module such that the control module assigns a value one to the least significant bit in this digital word if a voltage on the last capacitor charged by the use of the reference current source reached the threshold voltage, while the control module assigns a value one to a bit of n-bit output digital word if a capacitor in the set of capacitors has been charged by the use of the signal current source and the control module assigns a value zero to a bit otherwise.

6. The method according to claim 3, wherein a generation of a time interval by the use of the control module is terminated when a voltage decreasing on the sampling capacitor in the sampling module observed by the use of the signal comparator equals zero.

7. The method according to claim 6, wherein a binary value of n-bit output digital word is determined by the use of the control module such that the control module assigns a value one to a bit in this digital word if a next capacitor is not started to be charged by the use of the signal current source during a time when a capacitor corresponding to the bit in the set of capacitors is charged by the use of the reference current source, or a next capacitor is started to be charged by the use of the reference current source during a time when a capacitor corresponding to the bit in the set of capacitors is charged by the use of the signal current source, the control module assigns a value zero to the bit otherwise.

8. The method according to claim 5, wherein an intensity of the signal current source is lower than intensity of the reference current source during the time interval, and intensity of the signal current source is increased by the use of the control module to intensity of the reference current source at the instant when generation of the time interval is terminated by the use of the control module.

9. The method according to claim 7, wherein an intensity of the signal current source is lower than intensity of the reference current source during the time interval, and intensity of the signal current source is increased by the use of the control module to intensity of the reference current source at the instant when generation of the time interval is terminated by the use of the control module.

10. An apparatus for indirect conversion of a voltage value to a digital word comprising a control module having a trigger input, an output digital word, a complete conversion output, a reference input connected to a reference comparator output, a signal input connected to a signal comparator output, a reference output connected to a control input of a reference current source, a signal output connected to a control input of a signal current source, a sampling output connected to a control input of the sampling module, and control outputs of change-over switches of a set of capacitors, while a capacitance value of a capacitor of a given index is twice as high as a capacitance value of the capacitor of the previous index, and a non-inverting input of the reference comparator is connected to a reference rail and to an output of the reference current source, whose input is connected to a source of a voltage supply, and an inverting input of the reference comparator is connected to a source of a threshold voltage, while the sampling module comprises a voltage input and a sampling capacitor and is connected to a signal rail and to an output of the signal current source, wherein a non-inverting input of the signal comparator is connected to the signal rail and to the output of the signal current source whose input is connected to the source of the voltage supply, and the inverting input of the signal comparator is connected to the source of the threshold voltage and to the inverting input of the reference comparator, while bottom plates of capacitors of the set of capacitors are connected to a ground of a circuit, and top plates of capacitors are connected respectively to moving contacts of change-over switches whose first stationary contacts are connected to the signal rail, second stationary contacts are connected to the ground of the circuit, and third stationary contacts are connected to the reference rail.

11. The apparatus according to claim 10, wherein a top plate of a sampling capacitor in a sampling module is connected to a moving contact of a change-over switch of a top plate whose first stationary contact is connected to an input of a source of input voltage, and whose second stationary contact is connected to the signal rail, while a bottom plate of the sampling capacitor in the sampling module is connected to the ground of the circuit, and a control input of the change-over switch of the top plate is connected to a sampling output of the control module.

12. The apparatus according to claim 10, wherein the top plate of the sampling capacitor in the sampling module is connected to the moving contact of the change-over switch of the top plate whose first stationary contact is connected to the input of the source of input voltage, and whose second stationary contact is connected to the source of the threshold voltage, while the bottom plate of the sampling capacitor in the sampling module is connected to a moving contact of a change-over switch of a bottom plate, whose first stationary contact is connected to the ground of the circuit, and second stationary contact is connected to the signal rail, while a control input of the change-over switch of the top plate and a control input of the change-over switch of the bottom plate coupled together are connected to the sampling output of the control module.

13. The apparatus according to claim 11, wherein the signal current source and the reference current source have the same intensity, while a capacitance of the sampling capacitor in the sampling module is twice as high as a capacitance of the capacitor having the highest capacitance in the set of capacitors.

14. The apparatus according to claim 12, wherein the signal current source and the reference current source have the same intensity, while a capacitance of the sampling capacitor in the sampling module is twice as high as a capacitance of the capacitor having the highest capacitance in the set of capacitors.

15. The apparatus according to claim 11, wherein the intensity of the signal current source is controllable, and equals intensity of the reference current source, or is p times lower than intensity of the reference current source, while the capacitance of the sampling capacitor is p times lower than a double capacitance of the capacitor having the highest capacitance in the set of capacitors.

16. The apparatus according to claim 12, wherein the intensity of the signal current source is controllable, and equals intensity of the reference current source, or is p times lower than intensity of the reference current source, while the capacitance of the sampling capacitor is p times lower than a double capacitance of the capacitor having the highest capacitance in the set of capacitors.

* * * * *